(12) United States Patent
Lee

(10) Patent No.: US 7,538,572 B2
(45) Date of Patent: May 26, 2009

(54) OFF-CHIP DRIVER APPARATUS, SYSTEMS, AND METHODS

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/854,973

(22) Filed: Sep. 13, 2007

(65) Prior Publication Data

US 2009/0072860 A1    Mar. 19, 2009

(51) Int. Cl.
*H03K 17/16* (2006.01)
*H03K 19/003* (2006.01)

(52) U.S. Cl. .............................. 326/27; 326/26; 326/30; 326/87

(58) Field of Classification Search ............. 326/26–27, 326/30, 87; 327/112
See application file for complete search history.

(56) References Cited

U.S. PATENT DOCUMENTS

| | | | |
|---|---|---|---|
| 4,958,086 A | 9/1990 | Wang et al. | |
| 5,440,258 A | 8/1995 | Galbi et al. | |
| 7,112,989 B2 * | 9/2006 | Ooshita et al. | 326/27 |
| 7,203,243 B2 * | 4/2007 | Deas et al. | 375/257 |
| 7,304,504 B2 * | 12/2007 | Kang et al. | 326/87 |
| 2003/0193351 A1 * | 10/2003 | Fukui | 326/83 |
| 2004/0145394 A1 * | 7/2004 | Nedachi | 327/112 |
| 2007/0075745 A1 * | 4/2007 | Song et al. | 326/83 |

* cited by examiner

*Primary Examiner*—Anh Q Tran
(74) *Attorney, Agent, or Firm*—Schwegman, Lundberg & Woessner, P.A.

(57) ABSTRACT

Apparatus, methods, and systems include an off-chip driver having an output drive coupled in parallel with the off-chip driver to provide initial drive emphasis for a period of time. The output drive may include a first transistor and a second transistor coupled to an output of the off-chip driver to provide additional initial drive emphasis strength when both transistors are energized for an initial period of time. The time period may be set by an inverted delay circuit.

22 Claims, 13 Drawing Sheets

OFF-CHIP DRIVER APPARATUS, SYSTEMS, AND METHODS

BACKGROUND

Off-chip drivers (OCD) are commonly utilized to provide outputs from low voltage signal sources to higher voltage logic circuits. As data transmission rates continue to increase, an emphasis on energy conservation and reduced heat dissipation lead to reduced supply voltage levels. As a result of these changes, OCDs suffer from poor or incomplete signal swings. Increasing the driver size to make the OCD faster is not desirable, as the increased size is accompanied by greater power consumption, parasitic capacitance and less output impedance. In addition, the increased size may result in degraded signal integrity due to the OCD generating additional noise.

DETAILED DESCRIPTION

Figure 1A:
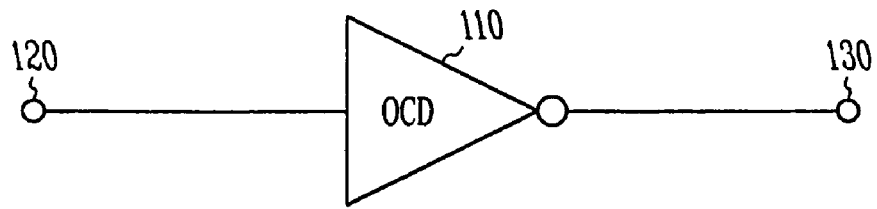
FIG. 1A shows an inverter that illustrates a prior art off-chip driver.
Figure 1B:
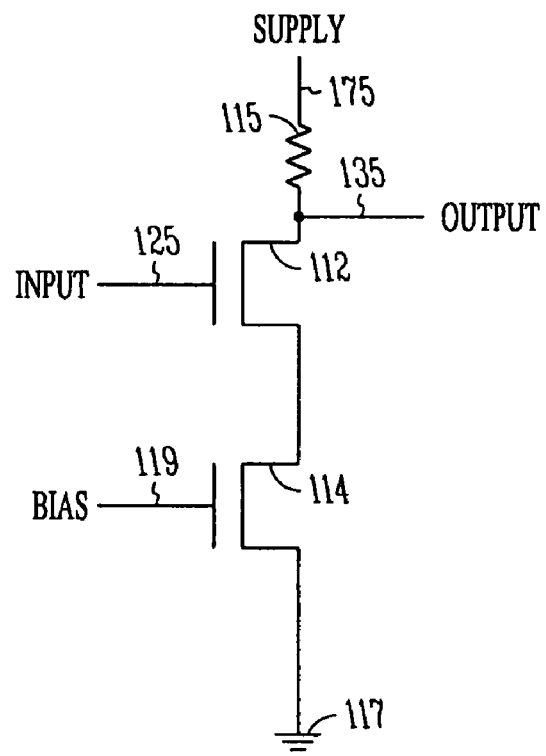
FIG. 1B shows a schematic diagram of another prior art off-chip driver.

FIG. 1A shows an inverter that that illustrates a prior art off-chip driver. The off-chip driver 110 represents off-chip drivers, which are sometimes also referred to as pad drivers commonly known in the art. The off-chip driver 110 of FIG. 1 shall be utilized to represent off-chip drivers (OCD) throughout the specification. OCD 110 includes an input 120 and an output 130. FIG. 1B shows a schematic diagram of an alternative OCD. The OCD of FIG. 1B and additional alternative off-chip drivers are known to one of ordinary skill in the art and should be understood to be interchangeable with OCD 110 of FIG. 1A.

FIG. 1B shows a schematic diagram of another prior art off-chip driver. The OCD of FIG. 1B comprises a pair of stacked transistors 112 and 114, for example N-channel field effect transistors. A resistor 115 is electrically connected to a supply voltage 175 and the first stacked transistor 112. The second stacked transistor 114 is connected to a ground 117. An input 125 is provided to the gate of the first stacked transistor 112. An output 135 is taken from the junction of the first stacked transistor 112 and the resistor 115. A bias voltage 119 is provided to set the pull-down current.

Figure 2:
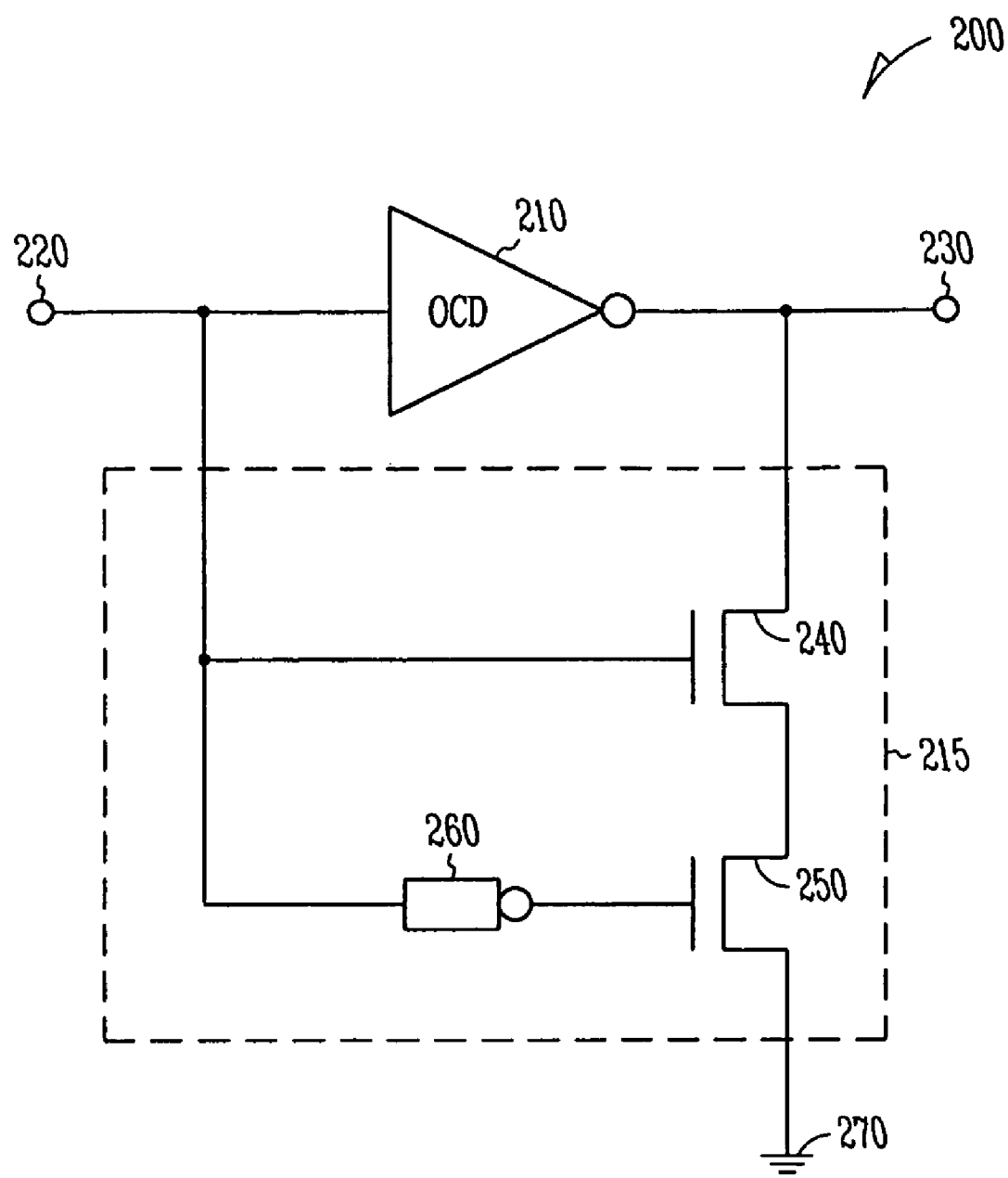
FIG. 2 shows a schematic diagram of an inverting off-chip driver with a pull-down initial drive emphasis according to an embodiment of the invention.

FIG. 2 shows a schematic diagram of an inverting off-chip driver 200 with pull-down initial drive emphasis according to an embodiment of the invention. Initial drive emphasis means providing the driver 200 with additional pull-down energy or drive to transition the output of the driver 200 at a faster rate of change. Driver 200 includes an off-chip driver 210 with input 220 and output 230. Driver 200 provides an extra pull-down path through an output drive, pull-down circuit 215, which includes stacked N-Channel field effect transistors (FET) 240 and 250, also known as field effect transistors (FETs). FET 240 has its gate connected to the input 220. FET 250 has its gate connected to an inverted delay 260 with a time delay (tD) that will vary based on the circuitry utilized. For example, inverted delay 260 may be an inverter with a tD equal to the response time (which is sometimes referred to bas the propagation delay) of the inverter. Other circuits may be utilized to operate as an inverted delay 260. One or more odd number of serial inverters or logic gates may be used, for example, such as a series of three NAND gates.

The drain of FET 240 is connected to the source of FET 250, and the drain of FET 250 is electrically connected to a ground 270. The source of FET 240 is connected to output 230. The pull-down circuit 215 operates to assist OCD 210 in providing the faster and stronger initial output at output 230. This is accomplished as both FET 240 and 250 are energized when the voltage at input 220 is first set high. Since OCD 210 inverts the voltage from input 220 to output 230, the output 230 will be low. When a high signal is received at input 220, FET 240 is energized. Since FET 250 has its gate connected to the output of inverted delay 260, FET 250 will already be energized. FET 240 and FET 250 assist in pulling the output 230 lower for approximately a period of time tD. Output 230 may see a sharper response than it would have seen from the use of OCD 210 alone. The additional pull-down assistance from pull-down circuit 215 is supplied for approximately a period of time tD as determined by the parameters of inverted delay 260. Once inverted delay 260 has timed out (e.g., the propagation delay is complete and the input signal to the inverted delay is passed on), and inverts the signal from input 220, FET 250 will receive a low output from inverted delay 260, effectively shutting it off, so that it will not pass current from the source to the drain. Therefore, for approximately an initial period of time equal to approximately tD, additional emphasis will be seen at output 230, resulting in a sharper signal response to input 220.

Figure 3:
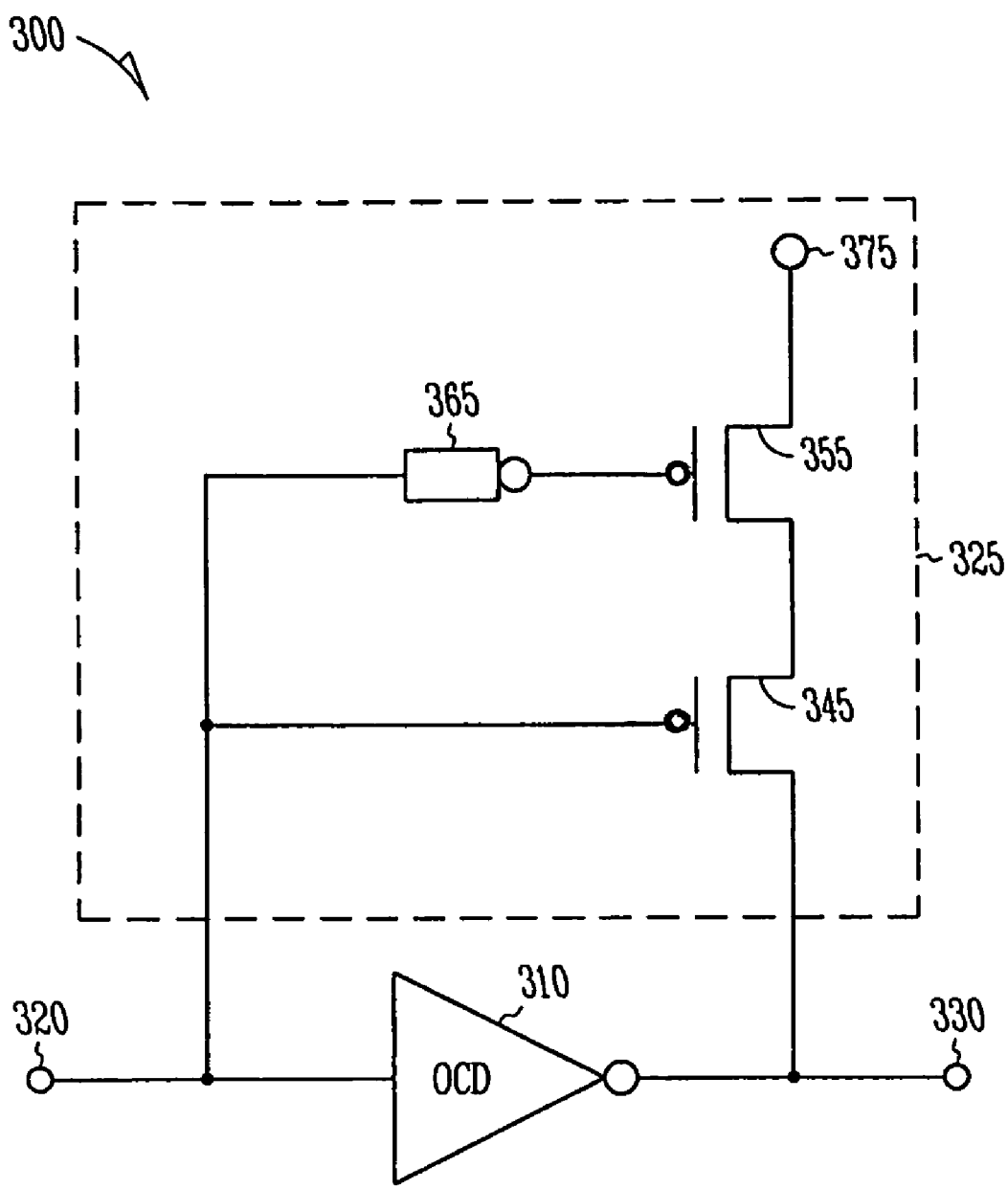
FIG. 3 shows a schematic diagram of an inverting off-chip driver with a pull-up initial drive emphasis according to an embodiment of the invention.

FIG. 3 shows a schematic diagram of an inverting off-chip driver 300 with a pull-up initial drive emphasis according to an embodiment of the invention. Driver 300 includes an OCD 310 with an input 320 and an output 330. Where driver 200 of FIG. 2 emphasized pull-down, driver 300 emphasizes pull-up. Driver 300 includes stacked P-Channel FETS 345 and 355.

FET 345 is positioned such that its gate is connected to the input 320 and its drain is connected to output 330. The gate of FET 355 is connected to an inverted delay 365 that is connected to input 320. The drain of FET 355 is connected to the source of FET 345. The source of FET 355 is connected to a supply voltage 375. Supply voltage 375 may be set at 5 volts or may be set higher or lower based on the overall system configurations which may be set based on the output signal desired. Supply voltage 375 may be set to a voltage at least as high as a high logic signal at output 330. As with FIG. 2, inverted delay 365 will have a delayed response of approximately length tD.

An output drive, pull-up circuit 325 operates to assist OCD 310 in providing the initial output to output 330. This is accomplished because both FET 345 and 355 are energized when the voltage at input 320 first transitions low. Since OCD 310 inverts the voltage from input 320 to output 330, the output 330 will be high. When a low signal is received at input 320, FET 345 is energized. Since FET 355 has its gate connected to the output of inverted delay 365, FET 355 will already be energized. FET 345 and FET 355 will assist in pulling the output 330 higher for approximately a period of time tD. Output 330 should see a sharper response than it would have seen from OCD 310 alone. The additional pull-up assistance from pull-up circuit 325 is supplied for approximately a period of time tD as determined by the parameters of inverted delay 365. Once inverted delay 365 has timed out and inverts the signal from input 320, FET 355 will receive a low output from inverted delay 365 and will not pass the current, as described previously.

Figure 4:
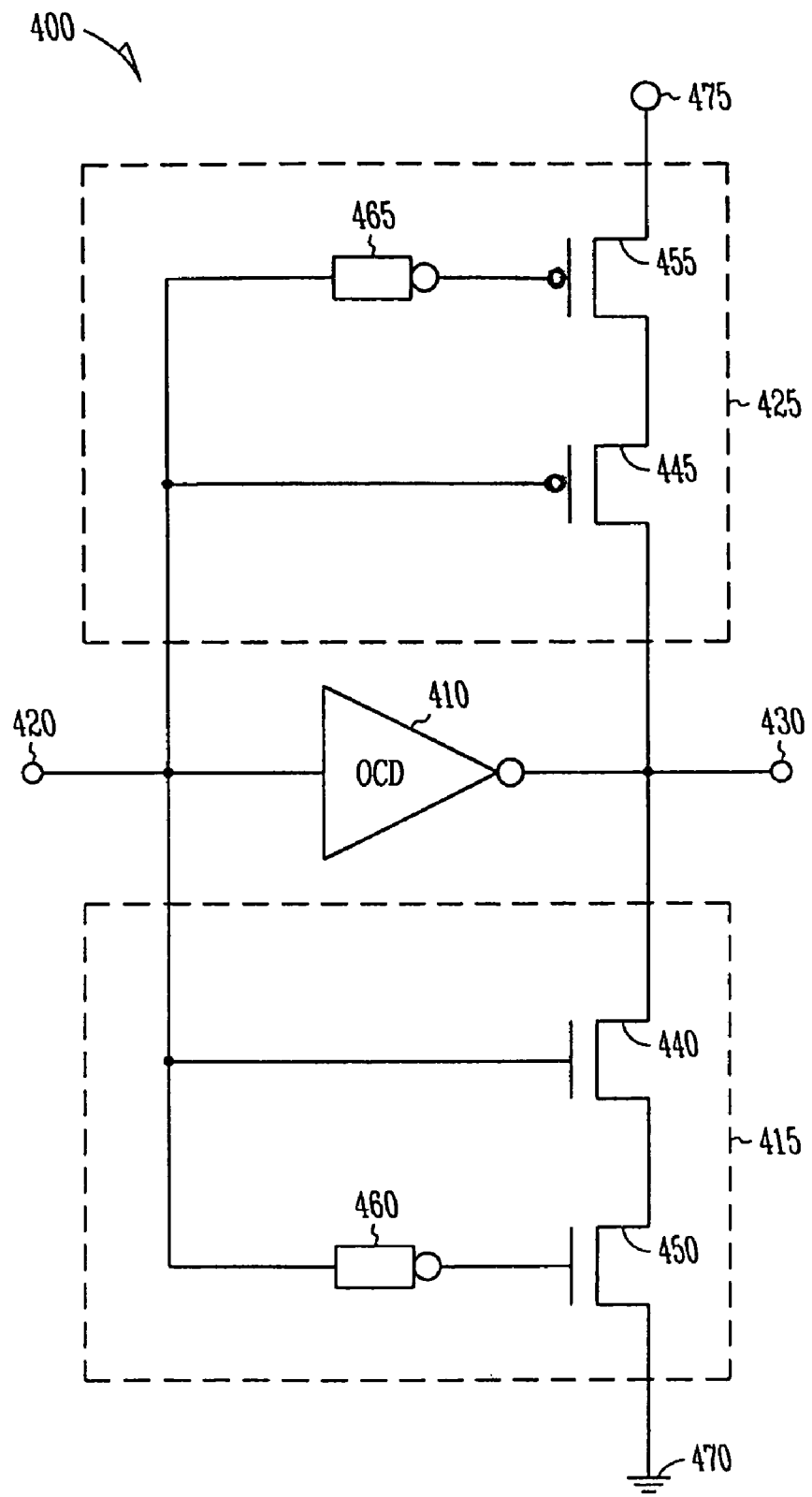
FIG. 4 shows a schematic diagram of an inverting off-chip driver with both a pull-up and a pull-down initial drive emphasis according to an embodiment of the invention.

FIG. 4 shows a schematic diagram of an inverting off-chip driver 400 with output drives providing both pull-up and pull-down initial drive emphasis according to an embodiment of the invention. Driver 400 includes an OCD 410, an output drive, pull-down circuit 415, and an output drive, pull-up circuit 425. Pull-down circuit 415 operates in a similar manner to pull-down circuit 215 of FIG. 2. Pull-down circuit 415 includes FET 440 and FET 450 stacked from output 430 to ground 470. The gate of FET 440 is connected to an input 420, and the gate of FET 450 is connected to inverted delay 460 which receives an input from input 420. Pull-up circuit 425 operates in a similar manner to pull-up circuit 325 of FIG. 3. Pull-up circuit 425 includes FET 445 and FET 455 stacked from output 430 to supply voltage 475. The gate of FET 445 is connected to input 420, and the gate of FET 455 is connected to inverted delay 465.

Figure 5:
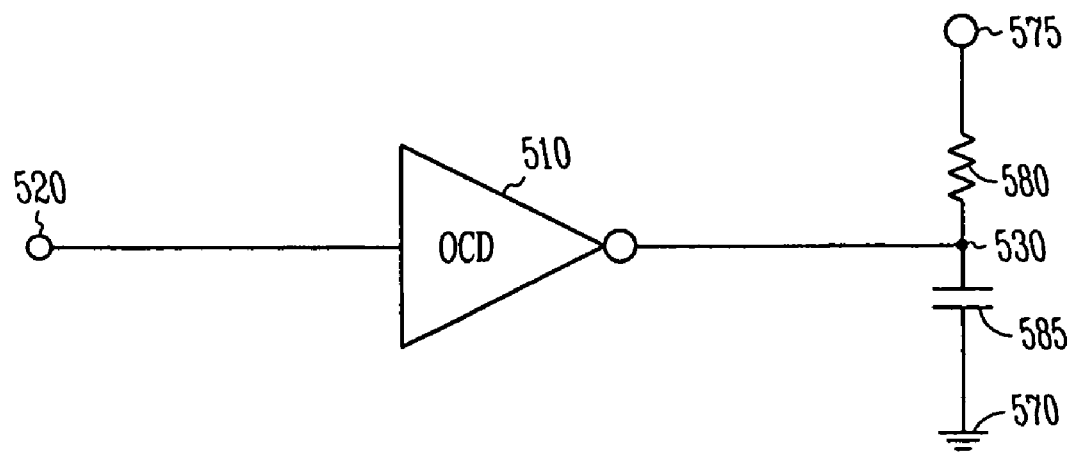
FIG. 5 shows a schematic diagram of a simulated prior art off-chip driver with a load.

FIG. 5 shows a schematic diagram of a simulated prior art off-chip driver with a load. OCD 510 is similar to OCD 110 of FIG. 1. An input is provided to input 520 to OCD 510. An output 530 from OCD 510 is provided to a test circuit comprising a resistor 580 in series with capacitor 585 from supply voltage 575 to ground 570. The output 530 is connected at the junction of resistor 580 and capacitor 585. FIG. 5 is provided with an input as represented in FIG. 7 at input 520 and the output at output 530 is also represented in FIG. 7.

Figure 6:
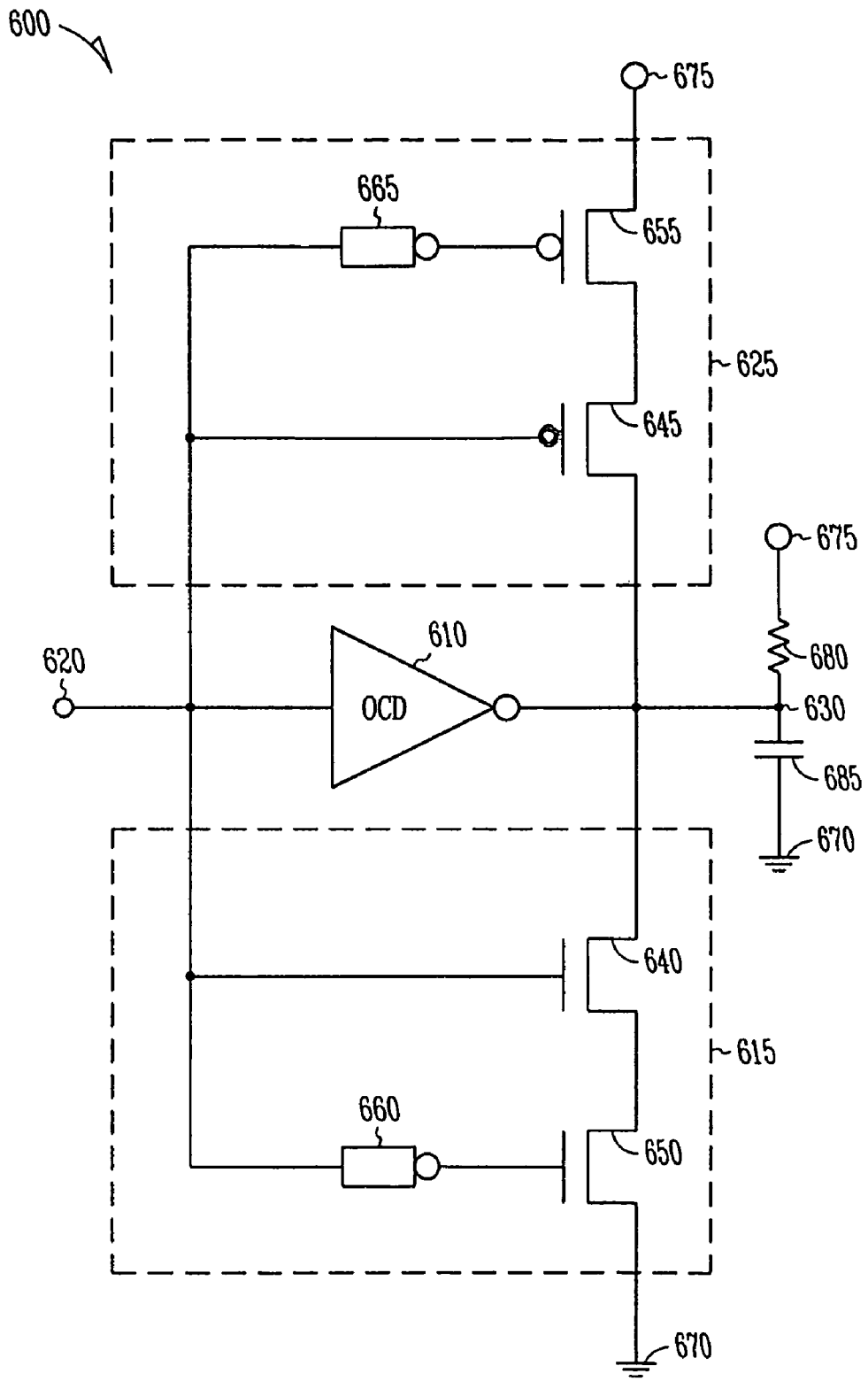
FIG. 6 is a schematic diagram of a simulated inverting off-chip driver with pull-down and pull-up initial drive emphasis with a load according to an embodiment of the invention.

FIG. 6 is a schematic diagram of a simulated inverting off-chip driver 600 with pull-down and pull-up initial drive emphasis with a load according to an embodiment of the invention. Driver 600 is similar to the embodiment described in FIG. 4. Driver 600 includes OCD 610, input 620 and output 630. Output 630 is connected between resistor 680 and capacitor 685, which are serially connected from supply voltage 675 to ground 670. Driver 600 also includes a pull-up circuit 625 and a pull-down circuit 615. As with FIG. 4 and FIG. 3, pull-up circuit 625 includes FET 645 and FET 655 stacked from supply voltage 675 to output 630. FET 655 has its gate connected to inverted delay 665, and the gate of FET 645 is connected to input 620. Pull-down circuit 615 is similar to both pull-down circuit 415 of FIG. 4 and pull-down circuit 215 of FIG. 2, and includes FET 640 and FET 650 stacked from output 630 to ground 670. The gate of FET 640 is connected to input 620 and the gate of FET 650 is connected to inverted delay 660, which is connected to input 620. The input to input 620 is illustrated in FIG. 7. The output from output 630 is also illustrated in FIG. 7 to better illustrate the benefits of the initial drive emphasis.

Figure 7:
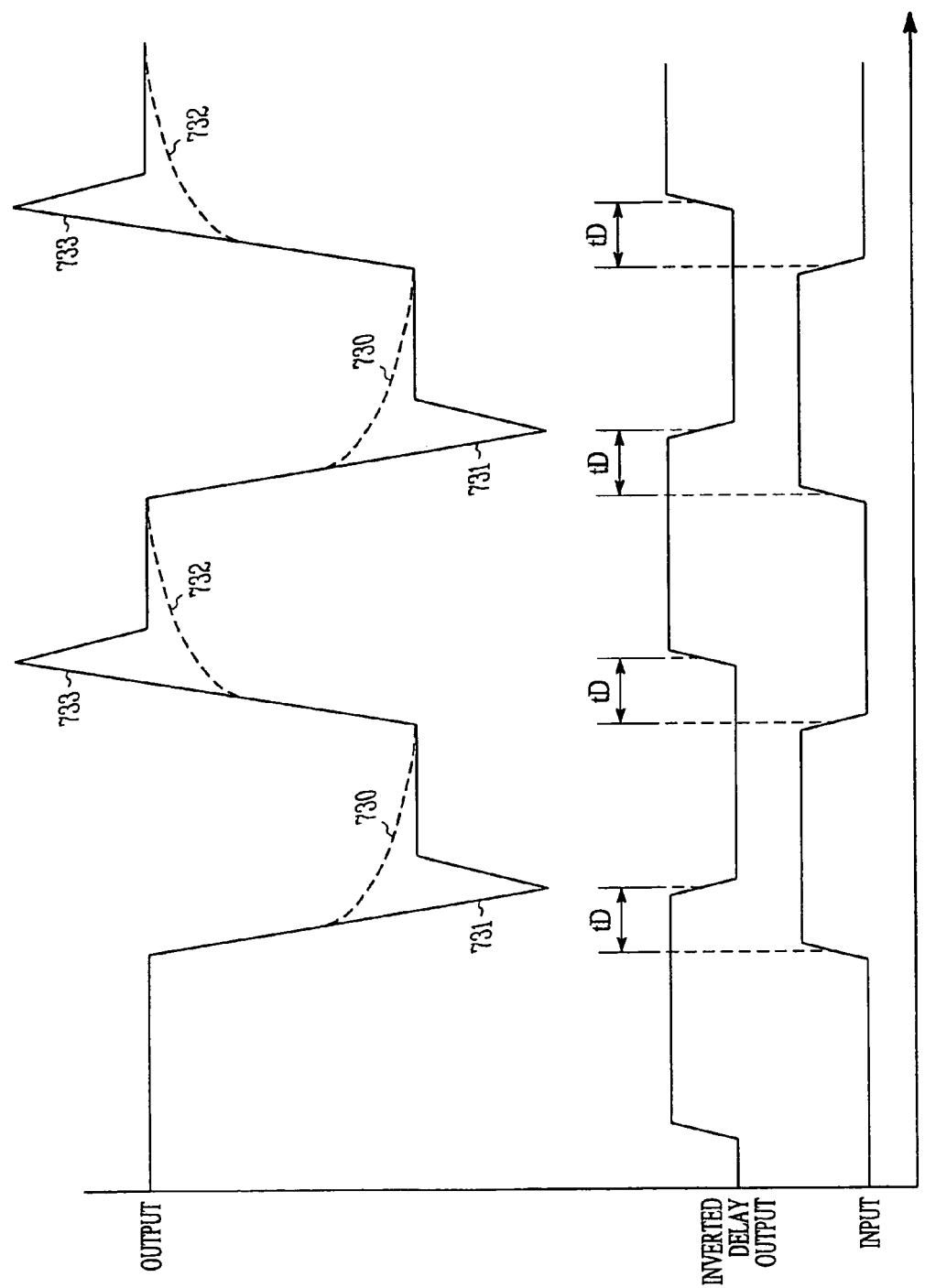
FIG. 7 is a timing diagram of the simulated outputs for the circuits of FIG. 5 and FIG. 6.

FIG. 7 is a timing diagram and a simulation of the outputs of the circuits from FIG. 5 and FIG. 6. The input signal at inputs 520 and 620 are shown as the input signal on the timing diagram of FIG. 7. The input signal is a square wave, which due to the time frame illustrated, has a moderate slope on both the up and the down swing of the signal. The data rate illustrated may be as high as 5 gigabytes per second, or higher. The output signal at output 630 of FIG. 6 is represented by waveform 731 for a high input and 733 for a low input. The output signal at output 530 of FIG. 5 is represented by waveforms 730 for a high input and 732 for a low input. As can be seen, the Inverted Delay output signal in the simulated embodiment of the invention (refer to FIG. 6, for example) will be at approximately the same level as the input signal for a period of time approximately equal to the time delay tD, which is set by the parameters of the inverted delay 660 of FIG. 6. Therefore, while the input signal and the Inverted Delay output signal are at the same level, both of the stacked FETs in the embodiment of FIG. 6 will be energized. Referring to FIG. 6, when both the input signal and the Inverted Delay output signal are high, FET 640 and FET 650 are energized. The result of the FET stack being energized results in a greater pull-down of the output 630.

The output signal from output 530 of FIG. 5 for a high input signal at input 520 is represented by waveform 730. The output signal from output 630 of FIG. 6 for a high input signal at input 620 is represented by waveform 731. It is apparent to one of ordinary skill in the art that the output signal of driver 600 has a sharper response than that of the output of OCD 510.

The output signal from output 530 of FIG. 5 for a low input signal at input 520 of FIG. 5 is represented by waveform 732. The output signal from output 630 of FIG. 6 for a low input signal at input 620 of FIG. 6 is represented by waveform 733. When both the input 620 and the inverted delay 665 output of FIG. 6 are at a low level, FET 645 and FET 655 are energized. The result of the FET stack being energized is a greater pull-up of the output 630 of FIG. 6. Again, it should be apparent to one of ordinary skill in the art that the output 630 of driver 600 has a sharper response than that of the output 530 of OCD 510.

As illustrated in FIG. 7 the strength of the output is greater providing a faster response when either the pull-up circuit 625 or the pull-down circuit 615 of FIG. 6 are energized for approximately the period of time tD. It may be possible to save energy by only energizing the pull-up circuit 625 and pull-down circuit 615 during the time tD. The use of pull-up/pull-down circuits reinforce the OCD 610 of FIG. 6 during tD at transition as shown in FIG. 7. The delayed output signal is delayed by a period of time approximately equal to tD, and is an inverted version of the input signal.

Figure 8:
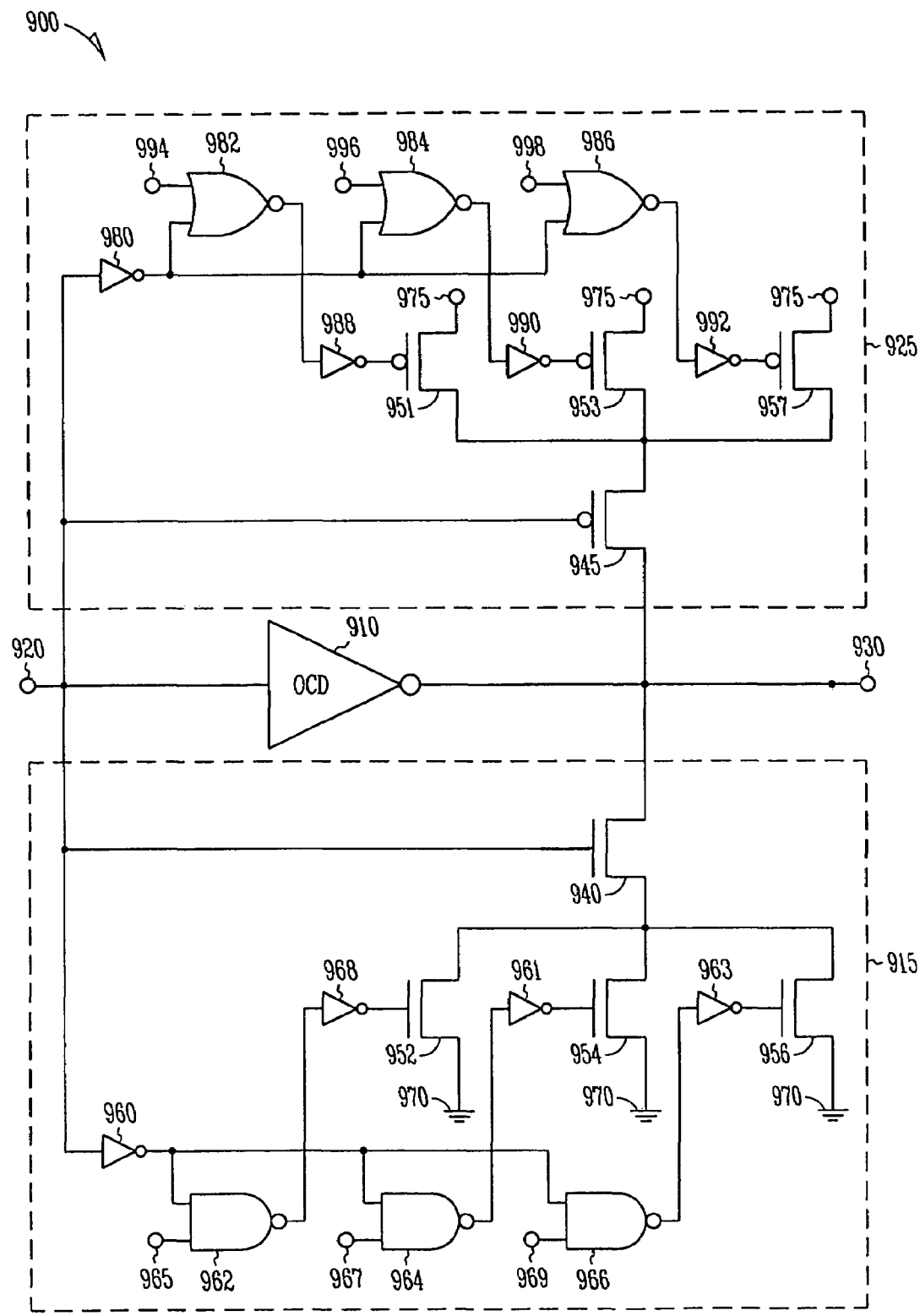
FIG. 8 shows a schematic diagram of an inverting off-chip driver with both a pull-up and a pull-down initial drive emphasis with adjustable initial drive emphasis according to an embodiment of the invention.

FIG. 8 shows a schematic diagram of an inverting off-chip driver 900 with both a pull-up and a pull-down initial drive emphasis with adjustable initial drive emphasis according to an embodiment of the invention. It may be possible to not only adjust the time period for additional initial drive emphasis in driver 900, but also to selectively set the amount of additional initial drive emphasis introduced into the system.

Driver 900 includes an OCD 910, an input 920 and an output 930. Driver 900 also includes output drives in pull-up circuit 925 and pull-down circuit 915. Pull-up circuit 925 includes FET 945, with the drain connected to output 930 and the gate connected to input 920. The source of FET 945 is connected to the drain of a plurality of FET 951, 953, and 957. The source of FET 951, 953 and 957 may be connected to a supply voltage 975. Pull-up circuit 925 may be used to set the level of additional pull-up strength it will add to OCD 910. The amount of additional pull-up strength is determined by controlling the inputs at input nodes 994, 996, and 998 as explained below.

An inverted delay may be made up of inverter 980, nor gate 982, and an inverter 988. Other combinations of logic circuits may be used. The input of an inverter 980 is connected to input 920. The output of the inverter 980 is provided to the input of three NOR gates 982, 984, and 986. The output of the NOR gate 982 is provided to inverter 988. The output of NOR gate 984 is provided to inverter 990. The output of NOR gate 986 is provided to inverter 992. Second inputs 994, 996, and 998 to NOR gates 982, 984 and 986, respectively, may be used to selectively include the associated FET device as part of the additional initial drive emphasis for pull-up circuit 925. The second input to NOR gates 982, 984 and 986 is set low to energize their respective FET transistors in the circuit, and is set high to de-energize the FET 951, 953, and 957. By setting the voltage at a second input 994 to NOR gate 982 low, prior to input 920 going low, the output of NOR gate 982 will be high, which will energize FET 951. When the input 920 goes low, the output from the inverter 980 will go high, and this will cause output from the NOR gate 982 to go low. The output of NOR gate 982 will be provided to the input of inverter 988, causing the output of inverter 988 to go high, de-energizing FET 951. The second inputs 994, 996, and 998 may be set by a logic circuit, during the fabrication, during the build of the chip set, or by connecting the second input 994, 996 or 998 to the output of the inverter 980.

If the input 994 is high, the output of NOR gate 982 will remain low regardless of the state of the input 920. Thus, FET 951 will not be energized as the output of NOR gate 982 remains low, and the output of inverter 988 will remain high. If the input 994 is low, and prior to transitioning low, input 920 is high, the output of NOR gate 982 will be high and the output of inverter 988 will be low. Therefore, FET 951 will be energized initially. When the input 920 transitions low, until the time delay tD has occurred, both FET 951 and 945 will be energized for the time tD. However, as input 920 transition low, the output from inverter 980 will transition high, followed by the output of NOR gate 982 transitioning low. Finally, inverter 988 will transition high, de-energizing FET 951. The time from when the signal at input 920 goes low until FET 951 de-energizes, is approximately tD.

Pull-down circuit 915 includes an FET 940, with its gate connected to the input 920 and its source connected to the output 930. The drain of FET 940 is connected to the source of FET 952, 954, and 956. The drain of FET 952, 954 and 956 may be connected to a ground 970. Pull-down circuit 915 may be used to set the level of additional pull-down strength it will add to OCD 910. The amount of additional pull-down strength is determined by controlling the inputs at input nodes 965, 967, and 969 as explained below.

The input of an inverter 960 is connected to input 920, and the output of the inverter 960 is provided to the input of NAND gates 962, 964, and 966. Other combinations of logic may be used. The output of the NAND gate 962 is provided to inverter 968. The output of NAND gate 964 is provided to inverter 961. The output of NAND gate 966 is provided to inverter 963. Second inputs 965, 967, and 969 of NAND gates 962, 964, and 966 may be used to selectively include the associated FET device in the additional initial drive emphasis for pull-down circuit 915. The second input 965, 967, or 969 to NAND gates 962, 964 and 966 is set high to energize their respective FET transistors in the circuit, and is set low to de-energize the FET 952, 954, and 956. By setting the voltage at the second input 965 to NAND gate 962 high, prior to input 920 going high, the output of NAND gate 962 will be low, causing the output of inverter 968 to go high, which will energize FET 952. The second inputs 965, 967, 969 may be set by a logic circuit, during the fabrication, during the build of the chip set, or by connecting the second input 965, 967 or 969 to the output of the inverter 960.

When the input 920 goes high, the output from the inverter 960 will go low, and this will cause output from the NAND gate 962 to go high. The output of NAND gate 962 will be provided to the input of inverter 968, causing the output of inverter 968 to go low, de-energizing FET 952. The time for FET 952 to receive the signal from inverter 968 to de-energize from the point input 920 goes high is equal to the time delay, approximately tD. If the input 965 is low, the output of NOR gate 982 will remain high regardless of the state of input 920. Thus, FET 952 will not energize.

As a result, the output of NAND gate 962 will be high and the output of inverter 968 will be low. Therefore, FET 952 will be energized until the time delay tD has passed. As a result, FET 952 and 940 will both be energized for approximately the time tD from the time the signal at input 920 goes low.

Figure 9:
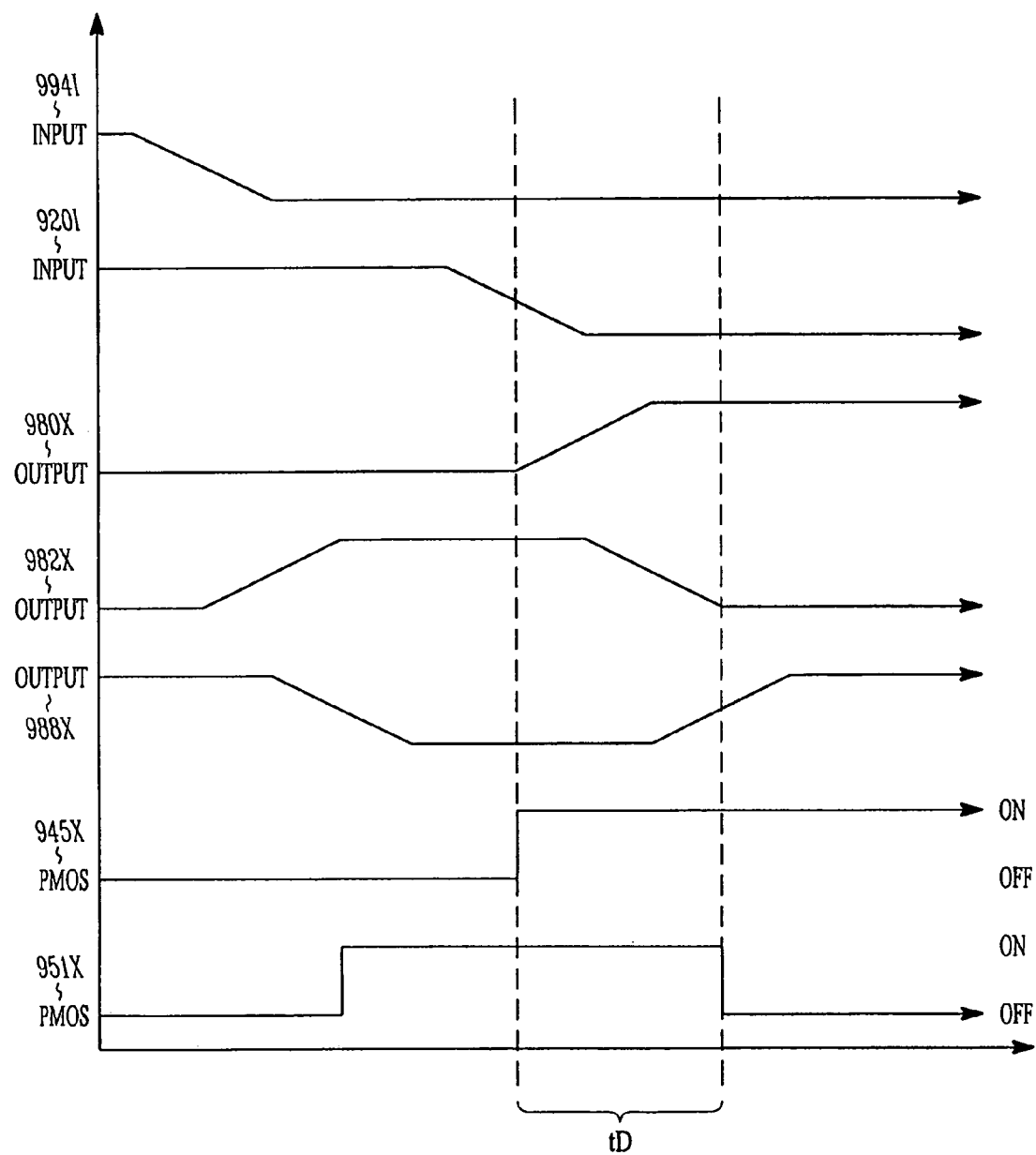
FIG. 9 shows a timing diagram for the embodiment of the invention illustrated in FIG. 8.

FIG. 9 shows a timing diagram for the embodiment of the invention illustrated in FIG. 8. The timing diagram illustrates the state of various outputs and inputs for the embodiment of the invention illustrated in FIG. 8. The second input 994 for NOR gate 982 of FIG. 8 shown as 994I, is set low prior to the signal at input 920I going low. In one embodiment of the invention the second input 994I of NOR gate 982 may be connected to the output 980 of the inverter 980 of FIG. 8. If this is the case, the delay tD may be shorter than the delay illustrated in the embodiment of FIG. 9.

When the input 920I is high, the output 980× from the inverter 980 is low. To include the FET 951 in the circuit, the second input 994I is set low. When the two inputs 994I and 980X to NOR gate 982 of FIG. 8 as illustrated, are both low, the output 982X from NOR gate 982 will go high. This will cause the output 988X of inverter 988 to go low and will energize FET 951.

With FET 951 energized, when the input 920I goes low FET 945 of FIG. 8 is energized, and for a period of time approximately equal to tD, the output 930 of OCD 910 of FIG. 8 receives additional emphasis, driving the output 930 high.

When the input 920I goes low, the output 980X of inverter 980 goes high, this will result in the output 982X of NOR gate 982 going low, which results in the output 988X of the inverter 988 going high and de-energizing the FET 951. As seen in FIG. 9, the transition time for each of the logic circuits to change is not immediate. The time for the logic elements, inverter 980, NOR gate 982 and inverter 988, to change states is approximately equal to the time delay tD. The time delay tD for the embodiment of the invention disclosed in FIG. 8 can be characterized as being approximately equal to the time delay of two inverters and the NOR gate. To increase this time delay, one may add additional inverter pairs to the logic circuit. Other logic circuitry can be used.

Figure 10:
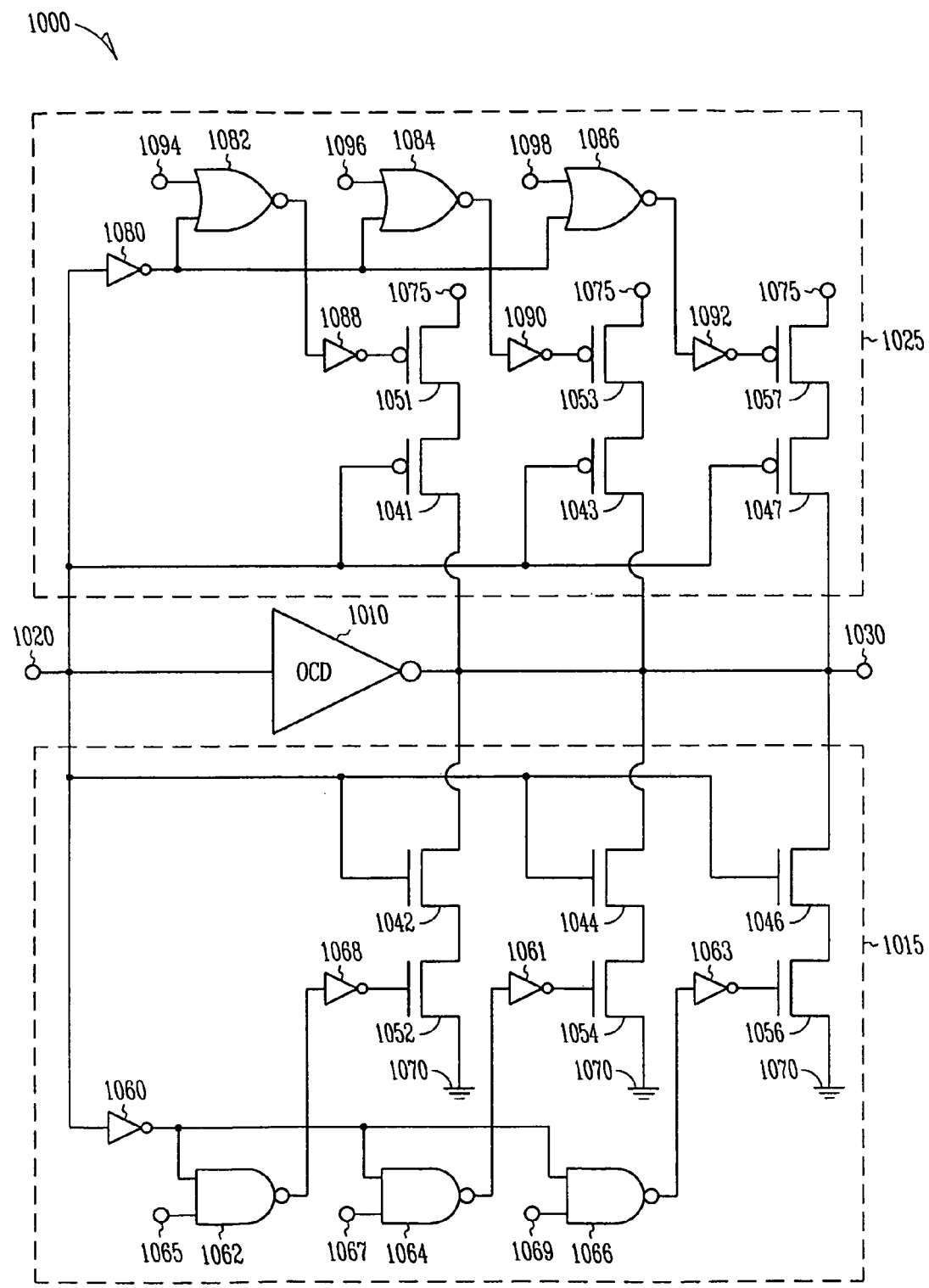
FIG. 10 shows a schematic diagram of an inverting off-chip driver with both a pull-up and a pull-down initial drive emphasis with adjustable initial drive emphasis according to an embodiment of the invention.

FIG. 10 shows a schematic diagram of an inverting off-chip driver 1000 with both a pull-up and a pull-down initial drive emphasis with adjustable initial drive emphasis according to an embodiment of the invention. Driver 1000 includes OCD 1010, input 1020 and output 1030. Driver 1000 also includes output drives pull-up circuit 1025 and pull-down circuit 1015.

Pull-up circuit 1025 includes FET 1041, 1043, and 1047, each having a drain connected to the output 1030 and a gate connected to the input 1020. Pull-up circuit 1025 also includes FET 1051, 1053, and 1057. The source of FET 1041 is connected to the drain of FET 1051. The source of FET 1043 is connected to the drain of FET 1053. The source of FET 1047 is connected to the drain of FET 1057. The source of FET 1051, 1053 and 1057 may be connected to the supply voltage 1075. Pull-up circuit 1025 may be used to set the level of additional pull-up strength it will add to OCD 1010. The input of an inverter 1080 is connected to input 1020. The output of the inverter 1080 is provided to the input of three NOR gates 1082, 1084, and 1086. Other combinations of logic circuitry may be used. The output of the NOR gate 1082 is provided to inverter 1088. The output of NOR gate 1084 is provided to inverter 1090. The output of NOR gate 1086 is provided to inverter 1092. The second input 1094, 1096 and 1098 to NOR gates 1082, 1084 and 1086 is set low to energize their respective FET transistors in the circuit, and is set high to de-energize the FET 1051, 1053, and 1057. By setting the voltage at the second input 1094 to NOR gate 1082 low, prior to input 1020 going low, the output of NOR gate 1082 will be high, which will energize FET 1051. When the input 1020 goes low, the output from the inverter 1080 will go high; this will cause output from the NOR gate 1082 to go low. The output of NOR gate 1082 will be provided to the input of inverter 1088, causing the output of inverter 1088 to go high, de-energizing FET 1051. As a result, the output of NOR 1082 will be low and the output of inverter 1088 will be high. Therefore, FET 1051 will be energized until the time delay of approximately tD has occurred. As a result, FET 1051 and 1041 will both be energized for approximately the time tD from the time the signal at input 1020 goes low.

If the input 1094 is high, the output of NOR gate 1082 will remain low regardless of the state of input 1020. Thus FET 1051 will not energize and no additional pull-up will be provided.

Pull-down circuit 1015 includes FET 1042, 1044, and 1046, each having a source connected to the output 1030 and a gate connected to the input 1020. Pull-down circuit 1015 also includes FET 1052, 1054, and 1056. The drain of FET 1042 is connected to the source of FET 1052. The drain of FET 1044 is connected to the source of FET 1054. The drain of FET 1046 is connected to the source of FET 1056. The drain of FET 1052, 1054 and 1056 may be connected to the ground 1070. Pull-down circuit 1015 may be used to set the level of additional pull-down strength it will add to OCD 1010. The input of an inverter 1060 is connected to input 1020. The output of the inverter 1020 is provided to the input of three NAND gates 1062, 1064, and 1066. Other combinations of logic circuitry may be used. The output of the NAND gate 1062 is provided to inverter 1068. The output of NAND gate 1064 is provided to inverter 1061. The output of NAND gate 1063 is provided to inverter 1063. The second input 1065, 1067 and 1069 to NAND gates 1062, 1064 and 1066 is set high to energize their respective FET transistors in the circuit, and is set low to de-energize the FET 1052, 1054, and 1056. By setting the voltage at the second input 1065 to NAND gate 1062 high, prior to input 1020 going high, the output of NAND gate 1062 will be low, which will energize FET 1052. When the input 1020 goes high, the output from the inverter 1060 will go low; this will cause output from the NAND gate 1062 to go high. The output of NAND gate 1062 will be provided to the input of inverter 1068, causing the output of inverter 1068 to go low, de-energizing FET 1052. As a result, the output of NAND 1062 will be high and the output of inverter 1068 will be low. Therefore, FET 1052 will be energized until the time delay approximately equal to tD has occurred. As a result, FET 1052 and 1042 will both be energized for approximately the time tD from the time the signal at input 1020 goes high.

If the input 1065 is low, the output of NAND gate 1062 will remain high regardless of the status of input 1020. Thus FET 1052 will not energize and no additional pull-down will be provided.

Figure 11:
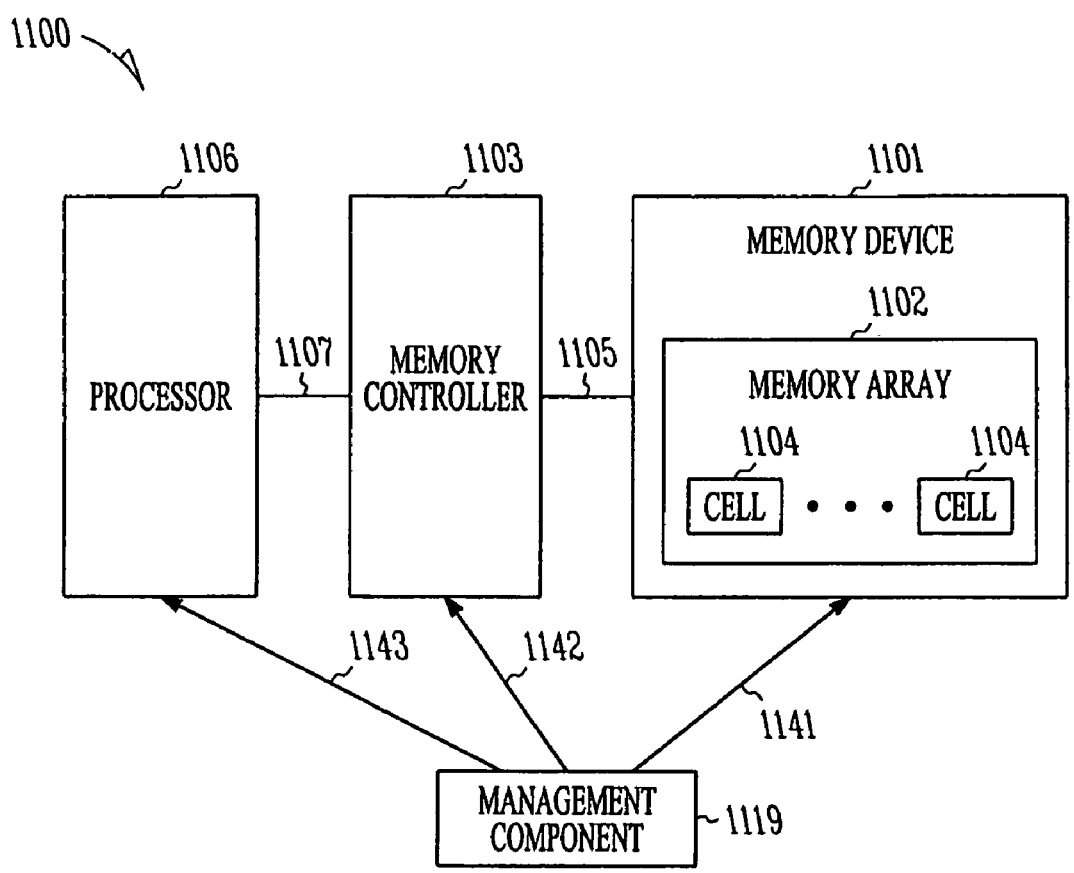
FIG. 11 shows a block diagram of a system according to an embodiment of the invention.

FIG. 11 shows a block diagram of a system 1100 according to an embodiment of the invention. System 1100 may form a portion of an electronic system such as a computer, a cellular phone, a Universal Serial Bus (USB) flash drive or a digital camera, for example and may include other electronic systems. As shown in FIG. 11, system 1100 may include a memory device 1101 having a memory array 1102 with cells 1104 made up of multi-die packages to store information such as data from a user and control data generated by system 1100. System 1100 may also include a memory controller 1103 to control communication between memory device 1101 and a processor 1106 via one or more interfaces or via bus 1105 and bus 1107.

System 1100 may further include a management component 1119, which may participate in the management of information in system 1100, including setting the amount of additional initial drive emphasis for an OCD for cells 1104 in system 1100. System 1100 may comprise one or more off chip drivers incorporating embodiments of the invention. The output drive may provide an initial drive emphasis for a period of time. Thus, any one or more of the cells 1104 may include one or more of the embodiments illustrated in FIGS. 2, 3, 4, 6, 8, and 10. The management component 1119 may be used to select and/or adjust pull-up and/or pull-down circuits via the application of appropriate logic signals within the various embodiments, as discussed previously.

In FIG. 11, arrows 1141, 1142, and 1143 indicate that either the entire management component 1119 may reside in one of memory device 1101, memory controller 1103, and processor 1106, or portions of management component 1119 may form parts of at least two of the memory device 1101, memory controller 1103, and processor 1106. Management component 1119 may include software program instructions, firmware, hardware, or a combination thereof. An example of firmware in management component 1119 includes basic input output system (BIOS) software stored in non-volatile memory, or formed as circuitry similar to BIOS circuitry of an electronic system. An example of hardware in management component 1119 includes circuit elements such as flip-flop circuitry, register circuitry, state machine circuitry, and other circuit elements.

Memory device 1101 of FIG. 11 may include a non-volatile memory device such as a flash memory device. Processor 1106 may include a general-purpose processor (e.g., a processor used in a computer) or an application specific integrated circuit (ASIC, e.g., a processor used in a cellular phone or a digital camera). Memory device 1101 and memory controller 1103 may be formed from the same semiconductor die and may be enclosed in the same semiconductor package or chip. Memory device 1101 and memory controller 1103 may also be formed from separate semiconductor dice and may be enclosed in separate semiconductor packages or separate chips. In some embodiments of system 1100, memory controller 1103 may be omitted, and memory device 1101 and processor 1106 may communicate with each other directly, or via one or both of buses 1105 and 1107. The memory array 1102 of the memory device 1101 may include one or more cells 1104.

Figure 12:
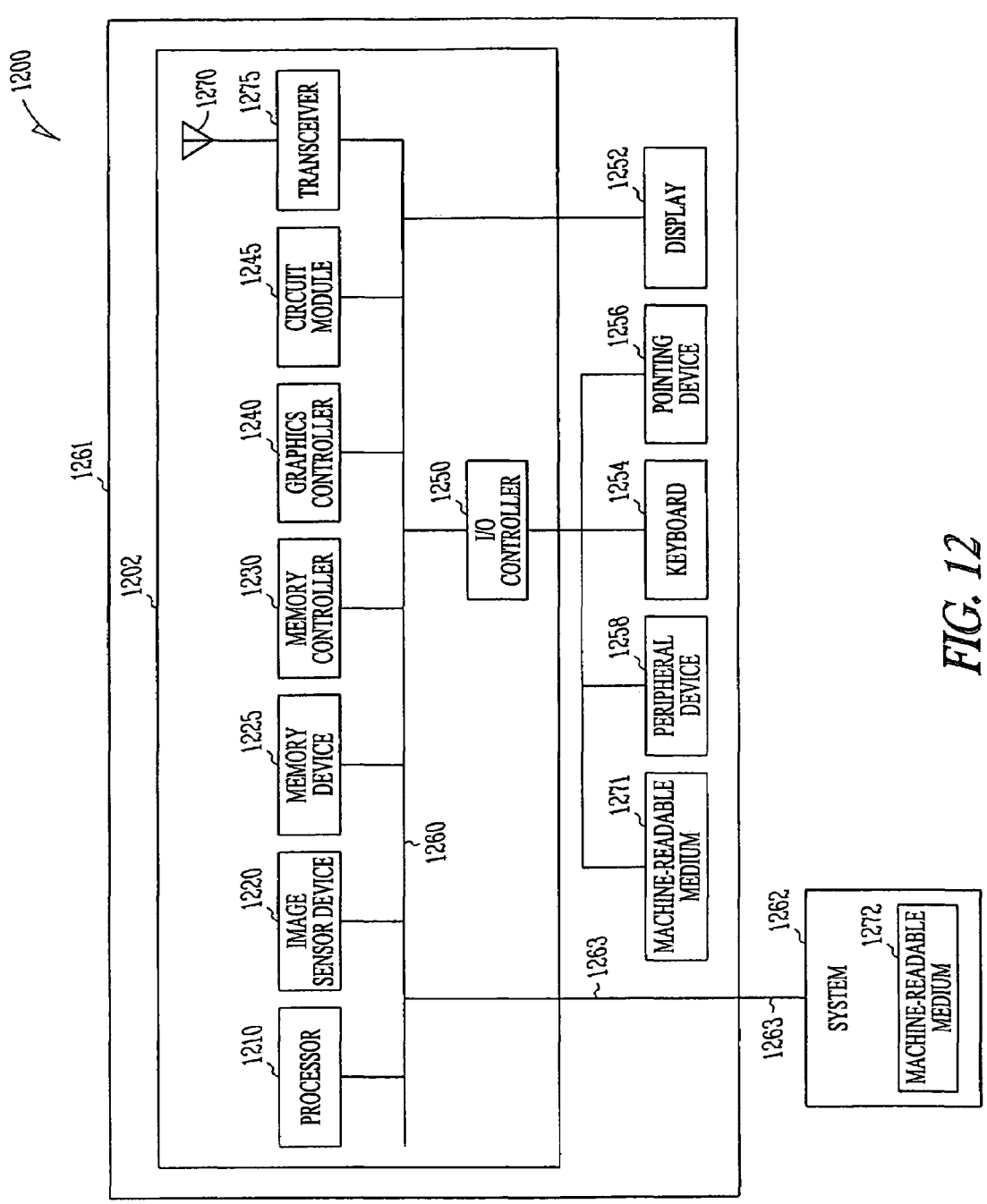
FIG. 12 shows a network according to an embodiment of the invention.

FIG. 12 shows a network 1200 according to an embodiment of the invention. Network 1200 may include systems 1261 and 1262 communicating with each other via a connection 1263. Connection 1263 may include a wired or wireless connection. In some embodiments, connection 1263 may include an Internet connection, or some other global network.

System 1261 may include a processor 1210, an image sensor device 1220, a memory device 1225, a memory controller 1230, a graphics controller 1240, a circuit module 1245, an I/O controller 1250, a display 1252, a keyboard 1254, a pointing device 1256, a peripheral device 1258, and a bus 1260 to transfer information among the components of system 1261. System 1261 may also include an antenna 1270 to transmit and receive information wirelessly. The antenna 1270 may be coupled via a transceiver 1275 to the bus 1260.

System 1261 may also include a circuit board 1202 on which some components of system 1261 may be located. In some embodiments, the number of components of system 1261 may vary. For example, in some embodiments, system 1261 may omit one or more of display 1252, image sensor device 1220, memory device 1225, and circuit module 1245. System 1261 may include an embodiment of system 1100 of FIG. 11.

Processor 1210 may include a general-purpose processor, e.g., a processor used in a computer. Processor 1210 may include an ASIC, e.g., a processor used in a cellular phone, or a digital camera or camcorder. Processor 1210 may comprise a single core processor or a multiple-core processor. Processor 1210 may execute one or more programming commands to process information to produce processed information. The information may include digital output information provided by other components of system 1261, such as image sensor device 1220 or memory device 1225.

Image sensor device 1220 may include a complementary metal-oxide-semiconductor (CMOS) image sensor having a CMOS pixel array or a charge-coupled device (CCD) image sensor having a CCD pixel array.

Memory device 1225 may include a volatile memory device, a non-volatile memory device, or a combination of both. For example, memory device 1225 may comprise a dynamic random access memory (DRAM) device, a static random access memory (SRAM) device, a flash memory device such as NAND or NOR flash memory device, or a combination of DRAM, SRAM, and flash memory devices. In some embodiments, memory device 1225 may include one or more embodiments of the OCD described above with reference to FIGS. 2, 3, 4, 6, 8, or 10.

Display 1252 may include an analog display or a digital display, including a liquid crystal display (LCD) or a plasma display. Display 1252 may receive information from other components. For example, display 1252 may receive information that is processed by one or more of image sensor device 1220, memory device 1225, graphics controller 1240, and processor 1210 to display information including text and images.

As shown in FIG. 12, system 1261 may include a machine-readable medium 1271. System 1262 may include a machine-readable medium 1272. Each of machine-readable media 1271 and 1272 may include a memory, e.g., removable storage media, and any memory including an electrical, optical, or electromagnetic conductor.

Figure 13:
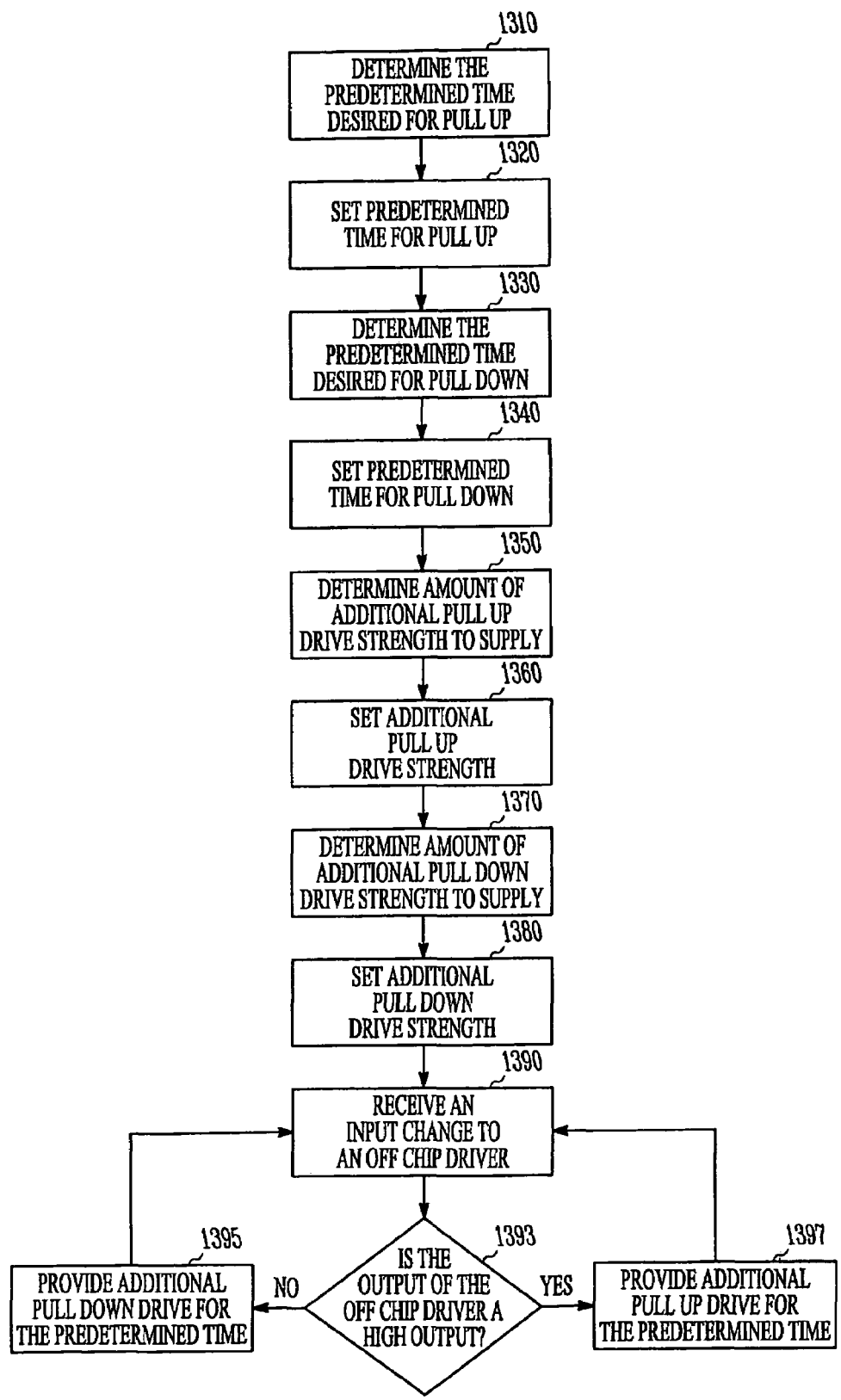
FIG. 13 shows a flow diagram of a method of setting the delay time and the strength of drive being provided to an off-chip driver according to an embodiment of the invention.

FIG. 13 shows a flow diagram of a method of adjusting/setting the delay time and adjusting/setting the initial drive emphasis being provided to an off-chip driver. Activity 1310 may comprise determining the length of time, tD, that the pull-up drive is desired to provide the additional pull-up strength to the OCD. For example the pull-up drive may comprise pull-up circuit 325 of FIG. 3. It may be possible to determine the amount of delay that would be useful to the OCD by analyzing the output of the OCD without the additional pull-up drive; it may also be possible to determine how much additional strength the OCD should be used with this type of analysis. Activity 1320 may then be to set the length of time tD the pull-up drive provides additional initial drive emphasis strength to the OCD. This may be done by adding additional time to the time delay (such as inverted delay 365 of FIG. 3). The time delay may also be extended by adding additional logic circuits to the system. For example, in FIG. 3, the inverted delay 365 may comprise an inverter. To add additional time delay, inverted delay 365 may comprise three inverters in series. In FIG. 10, the inverted delay for pull-up circuit 1025 comprises two inverters, 1080 and 1088, and a NOR gate 1082. The time delay is approximately equal to the time it takes each of these logic circuits to sense a change at the input and provide the appropriate output. It may be possible to add additional inverters and/or other logic circuits in pairs to increase the amount of delay. As illustrated in FIG. 11, management component 1119 or processor 1220 of FIG. 12 may be utilized to set or adjust tD. For example for additional pull-up emphasis, referencing FIG. 10, if inverter 1088 had a delay time of one inverter, inverter 1090 had a delay time of three inverters in series, and inverter, 1092 had a delay time of five inverters in series, management component 1119 of FIG. 11 or processor 1220 of FIG. 12 may be utilized to determine whether to activate the pull-up circuits.

Activity 1330 may include determining the desired length of time to provide an initial pull-down drive to the output of the off-chip driver from a pull-down drive. A pull-down drive may comprise, for example, pull-down circuit 215 of FIG. 2. In a manner similar to activity 1310, the length of time may be calculated, for example, by analyzing the output of the OCD without the additional pull-down drive being activated, and determining from this information the length of time that the OCD would benefit from the additional pull-down drive. Activity 1340 may then be to set the length of time tD to provide the desired additional pull-down drive to the OCD. This may be done in a similar manner to that of activity 1320 discussed above. The additional delay may be set by adding additional delay in the time delay (such as inverted delay 260 of FIG. 2). The time delay tD may be extended by adding additional logic circuits to the system. For example, in FIG. 2 the inverted delay 260 may comprise an inverter. In FIG. 10 the inverted delay for pull-down circuit 1015 comprises two inverters, 1060 and 1068, and a NAND gate 1062. As discussed earlier, management component 1119 of FIG. 11 or processor 1220 of FIG. 12 may be utilized to set tD. For example multiple pull-down circuits may be incorporated with differing delays, and management component 1119 or processor 1220 may be utilized to determine whether to activate the pull-down circuits. For example for additional pull-down emphasis, referencing FIG. 10, if inverter 1068 had a delay time of one inverter, inverter 1061 had a delay time of three inverters in series, and inverter, 1063 had a delay time of five inverters in series, management component 1119 of FIG. 11 or processor 1220 of FIG. 12 may be utilized to determine whether to activate the pull-down circuits.

Activity 1350 may be to determine the amount of additional pull-up initial drive emphasis that is desired. This may be done by analyzing the output characteristics of the OCD without the additional pull-up drive and may also include analyzing the characteristics of the output load receiving the signal from the OCD. Activity 1360 may then be to set or adjust the amount of additional pull-up drive strength on the pull-up drive. For example, in FIG. 10 pull-up circuit 1025 utilizes NOR gates 1082, 1084 and 1086 to set the additional initial drive emphasis strength. As discussed earlier, by setting inputs 1094, 1096, or 1098 low, their respective FET 1051, 1053 and 1057 are energized for the period of time, approximately tD, when pull-up drive is requested. By setting the inputs 1094, 1096 and 1098 high, FET 1051, 1053 and 1057 are de-energized. By selectively setting the inputs 1094, 1096 and 1098 it is possible to adjust the drive strength and de-energize transistors and other logic circuitry to decrease the drive strength.

Activity 1370 may be to determine an amount of initial pull-down drive strength to provide from the pull-down drive. This may be done by analyzing the output characteristics of the OCD without the additional pull-up drive, and may also include analyzing the characteristics of the output load receiving the signal from the OCD. Activity 1380 may be to set or adjust the amount of additional pull-down drive on the pull-down drive. For example, in FIG. 10 pull-up circuit 1015 utilizes NAND gates 1062, 1064 and 1066 to set the additional initial drive emphasis strength. As discussed earlier, by setting inputs 1065, 1064, or 1068 high their respective transistors 1052, 1054 and 1056 are energized for approximately the period of time tD when pull-down drive is requested. By setting the second inputs 1065, 1067 and 1069 low, transistors 1052, 1054 and 1056 are de-energized. Therefore, it is possible to selectively energize additional transistors to strengthen the drive and de-energize transistors to lower the drive strength. The processor 1220 of FIG. 12, or the management component 1119 of FIG. 11, may be utilized to selectively increase or decrease the additional pull-down emphasis by setting the inputs 1065, 1067 and 1069.

Activity 1390 may be to receive an input change to an off-chip driver. Activity 1393 may be to determine if the input change will result in a high output or a low output from the OCD. If a low output will result, activity 1395 may be to provide the additional pull-down initial drive emphasis to the output of the OCD for the period of time. If a high output will result, activity 1397 may be to provide additional pull-up initial drive emphasis to the output of the OCD for the period of time.

The Abstract of the Disclosure is provided to comply with 37 C.F.R. § 1.72(b) requiring an abstract that will allow the reader to quickly ascertain the nature of the technical disclosure. It is submitted with the understanding that it will not be used to interpret or limit the scope or meaning of the claims. The above description and figures illustrate embodiments of the invention to enable those skilled in the art to practice the embodiments of the invention. Thus the following claims are hereby incorporated into the Detailed Description, with each claim standing on its own as a separate embodiment.

What is claimed is:

1. An apparatus, comprising:
    an off-chip driver; and
    an output drive coupled with the off-chip driver to provide an initial drive emphasis, the output drive including a logic circuit to set a strength of the initial drive emphasis, the output drive further including:
        a first transistor coupled to an output of the off-chip driver and including a gate coupled to an input of the off-chip driver;
        a second transistor coupled to the first transistor, the first and the second transistors are N-channel field effect transistors;
        a first delay circuit including an output coupled to a gate of the second transistor and an input coupled to the input of the off-chip driver
        a third transistor coupled to the output of the off-chip driver, wherein a gate of the third transistor is coupled to the input of the off-chip driver;
        a fourth transistor coupled to the third transistor; and
        a second delay circuit coupled to a gate of the fourth transistor and the input of the off-chip driver, wherein the first and second transistors are configure to provide additional initial drive emphasis for a first output from the off-chip driver, and wherein the third and fourth transistors are configure to provide additional initial drive emphasis for a second output from the off-chip driver.

2. The apparatus of claim 1, wherein the third and fourth transistors are P-channel field effect transistors.

3. An apparatus, comprising:
    an off-chip driver; and
    an output drive coupled with the off-chip driver to provide an initial drive emphasis, the output drive comprising a first transistor having a gate, the first transistor coupled to an output of the off-chip driver, and the gate of the first transistor coupled to an input of the off-chip driver, a second transistor having a gate, and a delay circuit comprising a first inverter, wherein an input of the first inverter is coupled to the input of the off-chip driver, and a NAND gate, wherein an input of the NAND gate is coupled to an output of the first inverter, an output of the NAND gate is coupled to an input of a second inverter, and an output of the second inverter is coupled to the gate of the second transistor, wherein the second transistor is coupled to the first transistor, an output of the delay circuit is coupled to the gate of the second transistor, and an input of the delay circuit is coupled to the input of the off-chip driver.

4. An apparatus, comprising:
    an off-chip driver; and
    an output drive coupled with the off-chip driver to provide an initial drive emphasis, the output drive comprising a first transistor having a gate, the first transistor coupled to an output of the off-chip driver, and the gate of the first transistor coupled to an input of the off-chip driver, a second transistor having a gate, and a delay circuit comprising a first inverter, wherein an input of the first inverter is coupled to the input of the off-chip driver, and a NOR gate, wherein an input of the NOR gate is coupled to an output of the first inverter, an output of the NOR gate is coupled to an input of a second inverter, and an output of the second inverter is coupled to the gate of the second transistor, wherein the second transistor is coupled to the first transistor, an output of the delay circuit is coupled to the gate of the second transistor, and an input of the delay circuit is coupled to the input of the off-chip driver.

5. An apparatus, comprising:
    an off-chip driver; and
    an output drive coupled with the off-chip driver to provide an initial drive emphasis, the output drive comprising:
        a first transistor coupled to an output of the off-chip driver and having a gate coupled to an input of the off-chip driver;
        a second transistor coupled to the first transistor, wherein the first and the second transistors are N-channel field effect transistors;
        a first delay circuit having an input coupled to the input of the off-chip driver and an output coupled to a gate of the second transistor, the first delay circuit comprising a first inverter coupled to the input of the off-chip driver, wherein a first input of a first NAND gate is coupled to an output of the first inverter, an output of the first NAND gate is coupled to an input of a second inverter, and an output of the second inverter is coupled to the gate of the second transistor,
a third transistor coupled to the output of the off-chip driver and having a source, a drain, and a gate coupled to the input of the off-chip driver;
a fourth transistor coupled to the third transistor and having a source, a gate and a drain; and
a second delay circuit coupled to the gate of the fourth transistor and the input of the off-chip driver, wherein the first and second transistors are configured to provide additional initial drive emphasis for a first output from the off-chip driver, and wherein the third and fourth transistors are configured to provide additional initial drive emphasis for a second output from the off-chip driver.

6. An apparatus, comprising:
an off-chip driver; and
an output drive coupled with the off-chip driver to provide an initial drive emphasis, the output drive comprising:
  a first transistor coupled to an output of the off-chip driver and having a gate coupled to an input of the off-chip driver;
  a second transistor coupled to the first transistor, wherein the first and the second transistors are N-channel field effect transistors;
  a first delay circuit having an input coupled to the input of the off-chip driver and an output coupled to a gate of the second transistor, the first delay circuit comprising a first inverter, wherein an input of the first inverter is coupled to the input of the off-chip driver and a NOR gate, an input of the NOR gate is coupled to an output of the first inverter, an output of the NOR gate is coupled to an input of a second inverter, and an output of the second inverter is coupled to the gate of the fourth transistor,
  a third transistor coupled to the output of the off-chip driver and having a source, a drain, and a gate coupled to the input of the off-chip driver;
  a fourth transistor coupled to the third transistor and having a source, a gate and a drain; and
  a second delay circuit coupled to the gate of the fourth transistor and the input of the off-chip driver, wherein the first and second transistors are configured to provide additional initial drive emphasis for a first output from the off-chip driver, and wherein the third and fourth transistors are configured to provide additional initial drive emphasis for a second output from the off-chip driver.

7. The apparatus of claim 5, wherein the second delay circuit comprises:
a third inverter, wherein an input of the third inverter is coupled to the input of the off-chip driver and a NOR gate, an input of the NOR gate is coupled to an output of the third inverter, an output of the NOR gate is coupled to an input of a fourth inverter, and an output of the fourth inverter is coupled to the gate of the fourth transistor.

8. The apparatus of claim 1, wherein an amount of initial drive emphasis is adjustable.

9. The apparatus of claim 1, wherein a period of time initial drive emphasis is provided is adjustable.

10. An apparatus comprising:
an off-chip driver having an input and an output; and
a plurality of output drives, wherein at least one of the output drives comprise a first transistor having a gate, a second transistor having a gate, a first delay circuit, a third transistor coupled to the output of the off-chip driver and including a gate coupled to the input of the off-chip driver, a fourth transistor coupled to the third transistor, and a second delay circuit coupled to a gate of the fourth transistor and the input of the off-chip driver, wherein the first transistor is coupled to an output of the off-chip driver, the gate of the first transistor is coupled to the input of the off-chip driver, an input of the first delay circuit is coupled to the input of the off-chip driver, an output of the first delay circuit is coupled to the gate of the second transistor, and the second transistor is coupled to the first transistor; and wherein at least one of the output drives comprises logic gates coupled to the first and second transistors.

11. An apparatus comprising:
an off-chip driver having an input and an output;
a first inverter having an input and an output, wherein the input of the first inverter is coupled to the input of the off-chip driver;
a first transistor having a source, a gate and a drain, wherein the first transistor is coupled to the output of the off-chip driver, and the gate of the first transistor is coupled to the input of the off-chip driver; and
a plurality of output drives, wherein the output drives comprise a second transistor having a source, a gate and a drain, wherein the second transistor is coupled to the first transistor, an input of a NAND gate is coupled to the output of the first inverter, an output of the NAND gate is coupled to an input of a second inverter, and an output of the second inverter is coupled to the gate of the second transistor.

12. The apparatus of claim 11, further comprising:
a third transistor having a source, a gate and a drain, wherein the third transistor is coupled to the output of the off-chip driver, and the gate of the first transistor is coupled to the input of the off-chip driver, wherein the output drives further comprise a fourth transistor having a source, a gate, and a drain, wherein an input of a NOR gate is coupled to the output of the first inverter, an output of the NOR gate is coupled to an input of a third inverter, and an output of the third inverter is coupled to the gate of the fourth transistor.

13. A method, comprising:
receiving a change state for an input to an off-chip driver; and
energizing an initial drive for a period of time to provide initial drive emphasis to the off-chip driver, wherein energizing includes setting a strength of the initial drive emphasis using a plurality of logic gates of an output drive that includes:
  a first transistor coupled to an output of the off-chip driver and including a gate coupled to the input to the off-chip driver;
  a second transistor coupled to the first transistor;
  a first delay circuit including an output coupled to a gate of the second transistor and an input coupled to the input to the off-chip driver;
  a third transistor coupled to the output of the off-chip driver and including a gate coupled to the input to the off-chip driver;
  a fourth transistor coupled to the third transistor; and a second delay circuit coupled to a gate of the fourth transistor and the input to the off-chip driver.

14. The method of claim 13, wherein the period of time is set by at least one of the first and second delay circuits.

15. The method of claim 13, further comprising at least one of:
  setting an amount of initial drive emphasis for a pull-up circuit of the output drive and
  setting an amount of initial drive emphasis for a pull-down circuit of the output drive.

16. A method, comprising:
  setting a length of time to provide at least on of an additional pull-up initial drive emphasis and an additional pull-down initial drive emphasis to an output of an off-chip driver, wherein setting the length of time includes using at least a logic circuit of an output drive coupled to the off-chip driver;
  receiving an input change to the off-chip driver; and
  providing at least one of the additional drives for approximately the length of time, the output drive including:
    a first inverter having an input coupled to an input of the off-chip driver;
    a first transistor coupled to an output of the off-chip driver and having a gate coupled to the input of the off-chip driver; and
    a second transistor coupled to the first transistor, an input of a NAND gate is coupled to an output of the first inverter, an output of the NAND gate is coupled to an input of a second inverter, and an output of the second inverter is coupled to a gate of the second transistor.

17. The method according to claim 16, comprising:
  providing pull-up initial drive emphasis according to the additional pull-up initial drive emphasis time if the output of the off-chip driver has a first signal level and additional pull-down initial drive emphasis according to the additional pull-down initial drive emphasis time if the output of the off-chip driver has a second signal level.

18. The apparatus of claim 1, wherein the logic circuit includes a plurality of logic gates to set the strength of the initial drive emphasis when a signal at the output of the off-chip driver has a first signal level.

19. The apparatus of claim 18, wherein the logic circuit includes an additional plurality of logic gates to set the strength of the initial drive emphasis when the signal at the output of the off-chip driver has a second signal level.

20. The apparatus of claim 18, wherein the plurality of logic gates include NOR gates.

21. The apparatus of claim 18, wherein the plurality of logic gates include NAND gates.

22. An apparatus, comprising:
  an off-chip driver; and
  an output drive coupled with the off-chip driver to provide an initial drive emphasis, the output drive including a logic circuit to set a strength of the initial drive emphasis, the output drive further including:
    a first transistor coupled to an output of the off-chip driver and including a gate coupled to an input of the off-chip driver;
    a second transistor coupled to the first transistor;
    a first delay circuit including an output coupled to a gate of the second transistor and an input coupled to the input of the off-chip driver;
    a third transistor coupled to the output of the off-chip driver and including a gate coupled to the input of the off-chip driver;
    a fourth transistor coupled to the third transistor; and
    a second delay circuit including an output coupled to a gate of the fourth transistor and an input coupled to the input of the off-chip driver.

* * * * *